US006574250B2

(12) United States Patent  
Sun et al.

(10) Patent No.: US 6,574,250 B2  
(45) Date of Patent: Jun. 3, 2003

(54) LASER SYSTEM AND METHOD FOR PROCESSING A MEMORY LINK WITH A BURST OF LASER PULSES HAVING ULTRASHORT PULSE WIDTHS

(75) Inventors: Yunlong Sun, Beaverton, OR (US); Edward J. Swenson, Portland, OR (US); Richard S. Harris, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 186 days.

(21) Appl. No.: 09/757,418

(22) Filed: Jan. 9, 2001

(65) Prior Publication Data

US 2002/0003130 A1 Jan. 10, 2002

Related U.S. Application Data

(60) Provisional application No. 60/175,337, filed on Jan. 10, 2000, and provisional application No. 60/223,533, filed on Aug. 4, 2000.

(51) Int. Cl.[7] .............................. H01S 3/10; B23K 26/00
(52) U.S. Cl. ............................. 372/25; 372/10; 372/11; 372/12; 372/30; 372/18; 219/121.67; 219/121.68; 219/121.69
(58) Field of Search ............................. 372/10, 11, 12, 372/18, 25, 30; 438/130, 132, 601, 940; 219/121.67, 121.68, 121.69

(56) References Cited

U.S. PATENT DOCUMENTS

| 4,114,018 A | 9/1978 | Von Allmen et al. 219/121 LM |
| 4,646,308 A | 2/1987 | Kafka et al. .................. 372/25 |
| 4,932,031 A | 6/1990 | Alfano et al. ................. 372/41 |
| 5,034,951 A | 7/1991 | Edelstein et al. ............. 372/22 |
| 5,042,040 A | 8/1991 | Harvey et al. ................. 372/18 |
| 5,175,664 A | 12/1992 | Diels et al. ................. 361/213 |
| 5,208,437 A | 5/1993 | Miyauchi et al. ....... 219/121.67 |
| 5,265,114 A | 11/1993 | Sun et al. ..................... 372/69 |
| 5,473,624 A | 12/1995 | Sun ............................. 372/69 |
| 5,513,194 A | 4/1996 | Tamura et al. ................. 372/6 |
| 5,520,679 A | 5/1996 | Lin ............................... 606/5 |
| 5,539,764 A | 7/1996 | Shields et al. ............... 372/57 |
| 5,558,789 A | 9/1996 | Singh .................... 219/121.69 |
| 5,586,138 A | 12/1996 | Yokoyama .................... 372/97 |
| 5,627,848 A | 5/1997 | Fermann et al. .............. 372/18 |
| 5,656,186 A | 8/1997 | Mourou et al. ......... 219/121.69 |
| 5,720,894 A | * 2/1998 | Neev et al. ................... 216/65 |
| 5,725,914 A | 3/1998 | Opower ....................... 427/592 |

(List continued on next page.)

OTHER PUBLICATIONS

Time–Bandwidth Products, *Integrated Nd YAG or ND:YLF Picosecond Regenerative Amplifier System*, Feb. 2000.
Spectra–Physics, *TSUNAMI, The First Choice in Mode–Locked Ti:Sapphire Lasers.*
Spectra–Physics, *OPAL, The First Synchronously Pumped Optical Parametric Oscillator.*
Spectra–Physics, *MAI TAI, The First Tunable One–Box Ti:Sapphire Femtosecond Laser Source.*

Primary Examiner—Eddie Lee
Assistant Examiner—Matthew C Landau
(74) Attorney, Agent, or Firm—Stoel Rives LLP

(57) ABSTRACT

A burst (50) of ultrashort laser pulses (52) is employed to sever a conductive link (22) in a nonthermal manner and offers a wider processing window, eliminates undesirable HAZ effects, and achieves superior severed link quality. The duration of the burst (50) is preferably in the range of 10 ns to 500 ns; and the pulse width of each laser pulse (52) within the burst (50) is generally shorter than 25 ps, preferably shorter than or equal to 10 ps, and most preferably about 10 ps to 100 fs or shorter. The burst (50) can be treated as a single "pulse" by conventional laser positioning systems (62) to perform on-the-fly link removal without stopping whenever the laser system (60) fires a burst (50) of laser pulses (52) at each link (22). Conventional wavelengths or their harmonics can be employed.

60 Claims, 3 Drawing Sheets

U.S. PATENT DOCUMENTS

| | | |
|---|---|---|
| 5,742,634 A | 4/1998 | Rieger et al. .................. 372/25 |
| 5,751,585 A | 5/1998 | Cutler et al. ............ 364/474.03 |
| 5,786,560 A | 7/1998 | Tatah et al. ............. 219/121.77 |
| 5,811,751 A | 9/1998 | Leong et al. ............ 219/121.6 |
| 5,848,080 A | 12/1998 | Dahm .......................... 372/25 |
| 5,953,354 A | 9/1999 | Staver et al. ................. 372/18 |
| 5,956,354 A | 9/1999 | Yan .............................. 372/18 |
| 5,987,049 A | 11/1999 | Weingarten et al. .......... 372/70 |
| 5,998,759 A | 12/1999 | Smart .................... 219/121.69 |
| 6,025,256 A | 2/2000 | Swenson et al. ............. 438/601 |
| 6,057,180 A | 5/2000 | Sun et al. ................... 438/132 |
| 6,281,471 B1 | 8/2001 | Smart .................... 219/121.62 |
| 2001/0009250 A1 | 7/2001 | Herman et al. ........ 219/121.69 |

* cited by examiner

US 6,574,250 B2

LASER SYSTEM AND METHOD FOR PROCESSING A MEMORY LINK WITH A BURST OF LASER PULSES HAVING ULTRASHORT PULSE WIDTHS

RELATED APPLICATIONS

This patent application derives priority from U.S. Provisional Application No. 60/223,533, filed Aug. 4, 2000 and U.S. Provisional Application No. 60/175,337, filed Jan. 10, 2000.

TECHNICAL FIELD

The present invention relates to laser processing of memory or other IC links and, in particular, to a laser system and method employing a burst of laser pulses having ultrashort pulse widths to sever an IC link.

BACKGROUND OF THE INVENTION

Yields in IC device fabrication processes often incur defects resulting from alignment variations of subsurface layers or patterns or particulate contaminants. FIGS. 1, 2A, and 2B show repetitive electronic circuits 10 of an IC device or workpiece 12 that are commonly fabricated in rows or columns to include multiple iterations of redundant circuit elements 14, such as spare rows 16 and columns 18 of memory cells 20. With reference to FIGS. 1, 2A, and 2B, circuits 10 are also designed to include particular laser severable circuit links 22 between electrical contacts 24 that can be removed to disconnect a defective memory cell 20, for example, and substitute a replacement redundant cell 26 in a memory device such as a DRAM, an SRAM, or an embedded memory. Similar techniques are also used to sever links to program a logic product, gate arrays, or ASICs.

Links 22 are about 0.5–2 microns ($\mu$m) thick and are designed with conventional link widths 28 of about 0.8–2.5 $\mu$m, link lengths 30, and element-to-element pitches (center-to-center spacings) 32 of about 2–8 $\mu$m from adjacent circuit structures or elements 34, such as link structures 36. Although the most prevalent link materials have been polysilicon and like compositions, memory manufacturers have more recently adopted a variety of more conductive metallic link materials that may include, but are not limited to, aluminum, copper, gold nickel, titanium, tungsten, platinum, as well as other metals, metal alloys, metal nitrides such as titanium or tantalum nitride, metal silicides such as tungsten silicide, or other metal-like materials.

Circuits 10, circuit elements 14, or cells 20 are tested for defects, the locations of which may be mapped into a database or program. Traditional 1.047 $\mu$m or 1.064 $\mu$m infrared (IR) laser wavelengths have been employed for more than 20 years to explosively remove circuit links 22. Conventional memory link processing systems focus a single pulse of laser output having a pulse width of about 4 to 20 nanoseconds (ns) at each link 22. FIGS. 2A and 2B show a laser spot 38 of spot size diameter 40 impinging a link structure 36 composed of a polysilicon or metal link 22 positioned above a silicon substrate 42 and between component layers of a passivation layer stack including an overlying passivation layer 44 (shown in FIG. 2A but not in FIG. 2B), which is typically 2000–10,000 angstrom (Å) thick, and an underlying passivation layer 46. Silicon substrate 42 absorbs a relatively small proportional quantity of IR radiation, and conventional passivation layers 44 and 46 such as silicon dioxide or silicon nitride are relatively transparent to IR radiation. FIG. 2C is a fragmentary cross-sectional side view of the link structure of FIG. 2B after the link 22 is removed by the prior art laser pulse.

To avoid damage to the substrate 42 while maintaining sufficient energy to process a metal or nonmetal link 22, Sun et al. in U.S. Pat. No. 5,265,114 and U.S. Pat. No. 5,473,624 proposed using a single 9 to 25 ns pulse at a longer laser wavelength, such as 1.3 $\mu$m, to process memory links 22 on silicon wafers. At the 1.3 $\mu$m laser wavelength, the absorption contrast between the link material and silicon substrate 42 is much larger than that at the traditional 1 $\mu$m laser wavelengths. The much wider laser processing window and better processing quality afforded by this technique has been used in the industry for about three years with great success.

The 1.0 $\mu$m and 1.3 $\mu$m laser wavelengths have disadvantages however. The coupling efficiency of such IR laser beams into a highly electrically conductive metallic link 22 is relatively poor; and the practical achievable spot size 38 of an IR laser beam for link severing is relatively large and limits the critical dimensions of link width 28, link length 30 between contacts 24, and link pitch 32. This conventional laser link processing relies on heating, melting, and evaporating link 22, and creating a mechanical stress build-up to explosively open overlying passivation layer 44. Such a conventional link processing laser pulse creates a large heat affected zone (HAZ) that deteriorates the quality of the device that includes the severed link.

The thermal-stress explosion behavior is also somewhat dependent on the width of link 22. As the link width becomes narrower than about 1 $\mu$m, the explosion pattern of passivation layers 44 becomes irregular and results in an inconsistent link processing quality that is unacceptable and limits circuit density. Thus, the thermal-stress behavior limits the critical dimensions of links 22 and prevents greater circuit density.

U.S. Pat. No. 6,057,180 of Sun et al. and U.S. Pat. No. 6,025,256 of Swenson et al. more recently describe methods of using ultraviolet (UV) laser output to sever or expose links that "open" the overlying passivation by different material removal mechanisms and have the benefit of a smaller beam spot size. However, removal of the link itself by such a UV laser pulse requires the passivation material to be UV absorbing and is still a "thermal" process.

U.S. Pat. No. 5,656,186 of Mourou et al. discloses a general method of laser induced breakdown and ablation by high repetition rate ultrafast laser pulses.

U.S. Pat. No. 5,208,437 of Miyauchi et al. discloses a method of using a single pulse of a subnanosecond pulse width to process a link.

U.S. Pat. No. 5,742,634 of Rieger et al. discloses a simultaneously Q-switched and mode-locked neodymium (Nd) laser device with diode pumping. The laser emits a series of pulses each having a duration time of 60 to 300 picoseconds (ps), under an envelope of a time duration of 100 ns. Pulses having a duration time of 60 to 300 ps exhibit a "thermal" mechanism of material processing.

SUMMARY OF THE INVENTION

An object of the present invention is to provide a method or apparatus for improving the quality of laser processing of IC links.

Another object of the invention is to process links with bursts of ultrashort laser pulses that have a nonthermal interaction with the overlying passivation layer and the link material.

A further object of the invention is to employ the bursts of ultrashort laser pulses to process the links on-the-fly.

The present invention employs a burst ultrashort laser pulses to sever an IC link, instead of using a single multiple-nanosecond laser pulse of conventional link processing systems. The duration of the burst is preferably in the range of 10 to 500 ns; and the pulse width of each laser pulse within the burst is generally shorter than 25 ps, preferably shorter than or equal to 10 ps, and most preferably about 10 ps to 100 femtoseconds (fs). Because each laser pulse within the burst is ultrashort, its interaction with the target materials (passivation layers and metallic link) is not thermal. Each laser pulse breaks off a thin sublayer of about 100–2,000 Å of material, depending on the laser energy, laser wavelength, and type of material, until the link is severed. The number of ultrashort laser pulses in the burst is controlled such that the last pulse cleans off the bottom of the link leaving the underlying passivation layer and the substrate intact. Because the whole duration of the burst is in the range of 10 ns to 500 ns, the burst is considered to be a single "pulse" by a traditional link-severing laser positioning system. Thus, the laser system can still process links on-the-fly, i.e. the positioning system does not have to stop moving when the laser system fires a burst of laser pulses at each link.

In addition to the "nonthermal" and well-controllable nature of ultrashort-pulse laser processing, the most common ultrashort-pulse laser source emits at a wavelength of about 800 nm and facilitates delivery of a small-sized laser spot. Preferably, a diode-pumped, or diode-pumped solid-state continuous wave (CW) green pumped, mode-locked, solid-state laser is employed to generate the ultrashort pulses at conventional wavelengths or their harmonics.

Additional objects and advantages of this invention will be apparent from the following detailed description of preferred embodiments thereof which proceeds with reference to the accompanying drawings.

DETAILED DESCRIPTION OF PREFERRED EMBODIMENT

Figure 1:
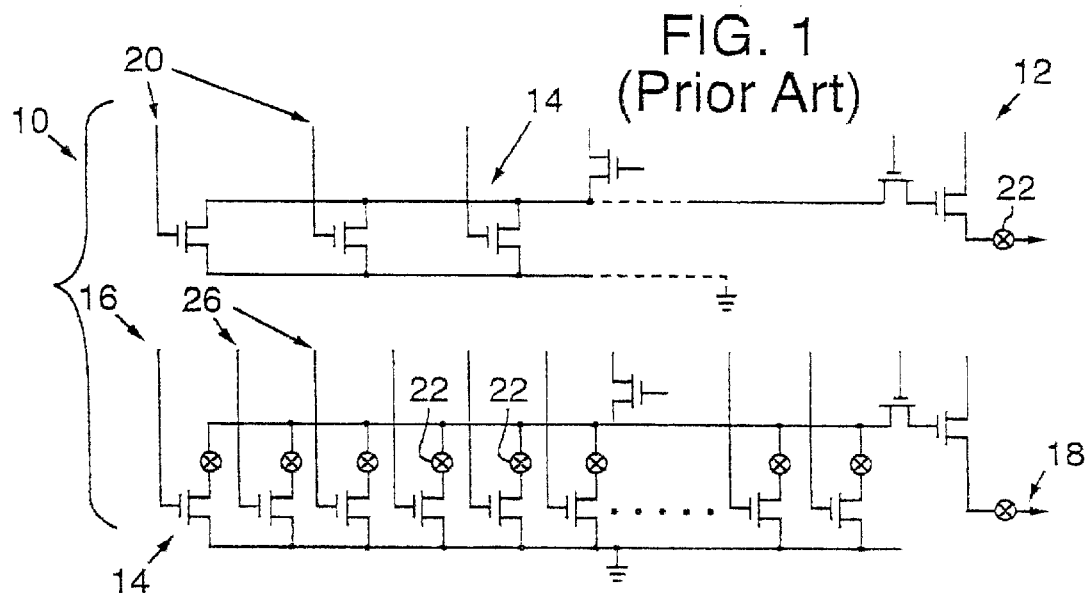
FIG. 1 is a schematic diagram of a portion of a DRAM showing the redundant layout of and programmable links in a spare row of generic circuit cells.
Figure 2A:
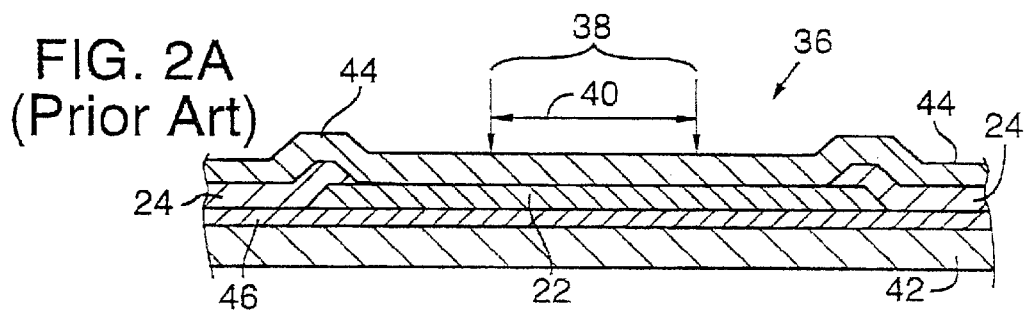
FIG. 2A is a fragmentary cross-sectional side view of a conventional, large semiconductor link structure receiving a laser pulse characterized by a prior art pulse parameters.
Figure 2B:
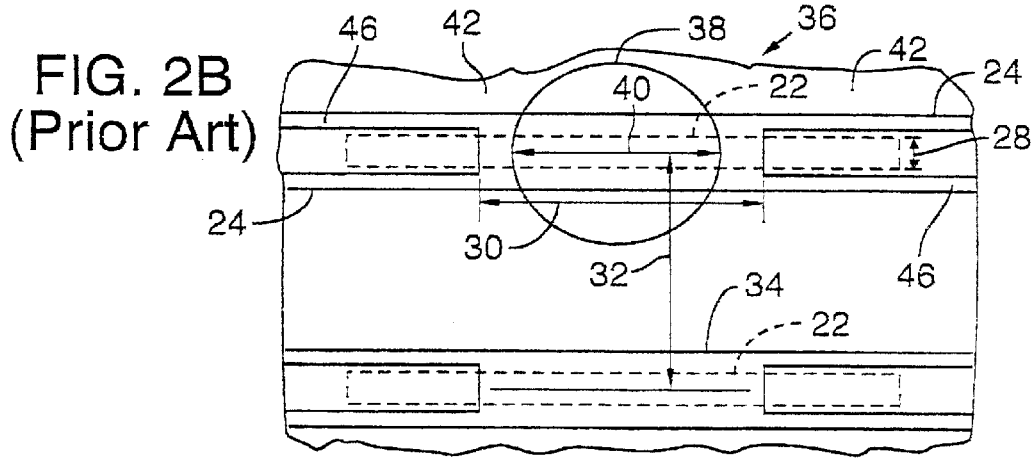
FIG. 2B is a fragmentary top view of the link structure and the laser pulse of FIG. 2A, together with an adjacent circuit structure.
Figure 2C:
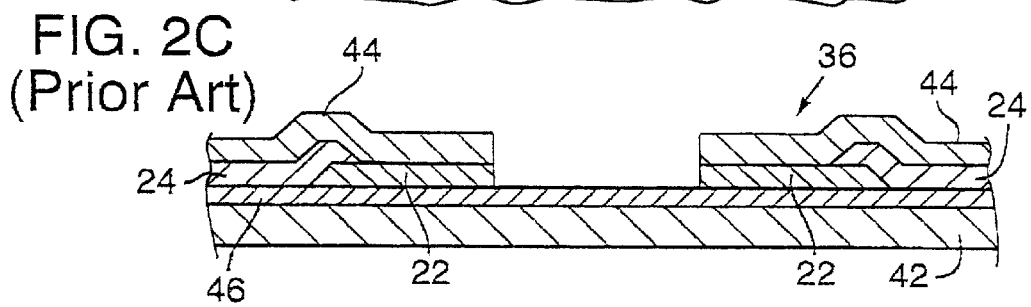
FIG. 2C is a fragmentary cross-sectional side view of the link structure of FIG. 2B after the link is removed by the prior art laser pulse.
Figure 3:
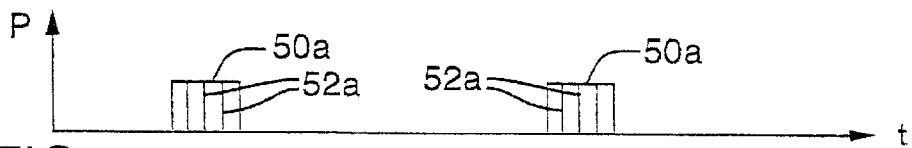
FIG. 3 shows a power versus time graph of exemplary bursts of ultrashort laser pulse employed to sever links in accordance with the present invention.
Figure 4:
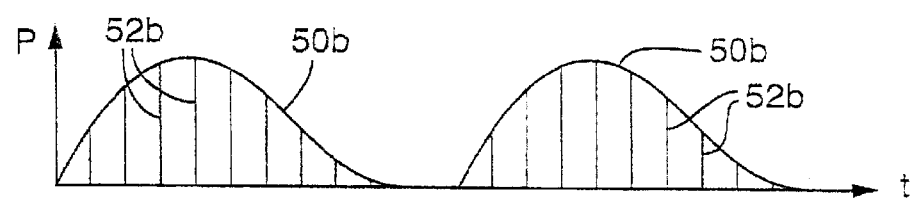
FIG. 4 shows a power versus time graph of alternative exemplary bursts of ultrashort laser pulses employed to sever links in accordance with the present invention.
Figure 5:
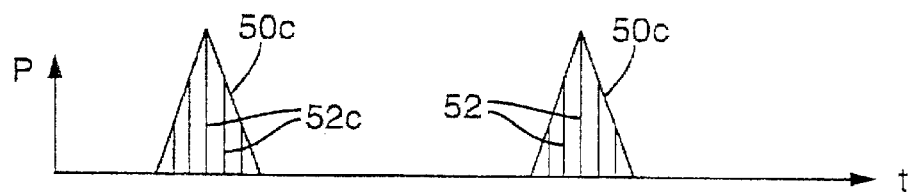
FIG. 5 shows a power versus time graph of other alternative exemplary bursts of ultrshort laser pulses employed to sever links in accordance with the present invention.

FIGS. 3–5 show power versus time graphs of exemplary bursts $50a$, $50b$, $50c$ (generically bursts 50) of ultrashort laser pulses $52a$, $52b$, $52c$ (generically laser pulses 52) employed to sever links 22 in accordance with the present invention. The duration of each burst 50 is preferably less than 500 ns and more preferably in the range of 10 ns to 200 ns. The pulse width of each laser pulse 52 within burst 50 is generally shorter than 25 ps, preferably shorter than or equal to 10 ps, and most preferably about 10 ps to 100 fs or shorter. The laser pulse widths are preferably shorter than 10 ps because material processing with such laser pulses 52 is believed to be a nonthermal process unlike material processing with laser pulses of longer pulse widths.

During a burst 50 of laser pulses 52, each laser pulse 52 pits off a small part or sublayer of the passivation layer 44 and/or link material needed to be removed without generating significant heat in link structure 36 or IC device 12. Preferably laser spot 38 is focused at overlying passivation layer 44. Due to its extremely short pulse width, each pulse exhibits high laser energy intensity that causes dielectric breakdown in conventionally transparent passivation materials. Each laser pulse breaks off a thin sublayer of, for example, about 1,000–2,000 Å of overlying passivation layer 44 until overlying passivation layer 44 is removed. Consecutive ultrashort laser pulses ablate metallic link 22 in a similar layer by layer manner. For conventionally opaque material, each ultrashort pulse ablates a sublayer having a thickness comparable to the absorption depth of the material at the wavelength used. At wavelengths in the near UV, visible, and near IR, the absorption or ablation depth per single ultrashort laser pulse for most metals is about 100–300 Å.

Depending on the wavelength of laser output and the characteristics of the link material, the severing depth of pulse 52 applied to link 22 can be accurately calculated and controlled by choosing the energy of each pulse 52 and the number of laser pulses in each burst to clean off the bottom of any given link 22, leaving underlying passivation layer 46 and substrate 42 intact. Hence, the risk of damage to silicon substrate 42 is substantially eliminated, even if a laser wavelength in the near UV range is used. Although in many circumstances, a wide range of energies per ultrashort laser pulse 52 will yield substantially similar severing depths. In a preferred embodiment, each ultrashort laser pulse 52 ablates about a 0.02–0.2 $\mu$m depth of material within spot size 40. In general, preferred ablation parameters of focused spot size 40 include laser energies of each burst between 0.01 $\mu$J and 10 mJ at greater than about 1 Hz, and preferably 1 kHz to 20 kHz or higher. Preferred bursts 50 include 2 to 50 ultrashort pulses 52, and more preferably 4 to 20 ultrashort pulses 52.

Figure 8:
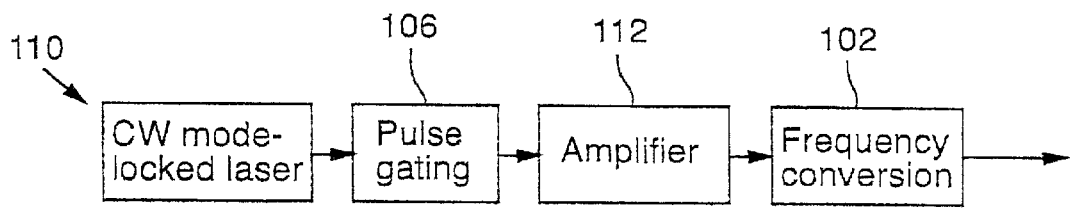
FIG. 8 is a schematic diagram of another laser configuration that can be employed in accordance with the present invention.

The energy density profile of a burst 50 of ultrashort pulses 52 can be controlled better than the energy density profile of a conventional single multiple-nanosecond laser pulse. With reference to FIG. 3, each ultrashort pulse $52a$ can be generated with the same energy density to provide a pulse burst $50a$ with a consistent "flat-top" energy density profile. Burst $50a$ can be accomplished with a mode-locked laser having an electro-optic (E-O) or acousto-optic (A-O) optical gate and with an optional amplifier (FIG. 8).

Figure 6:
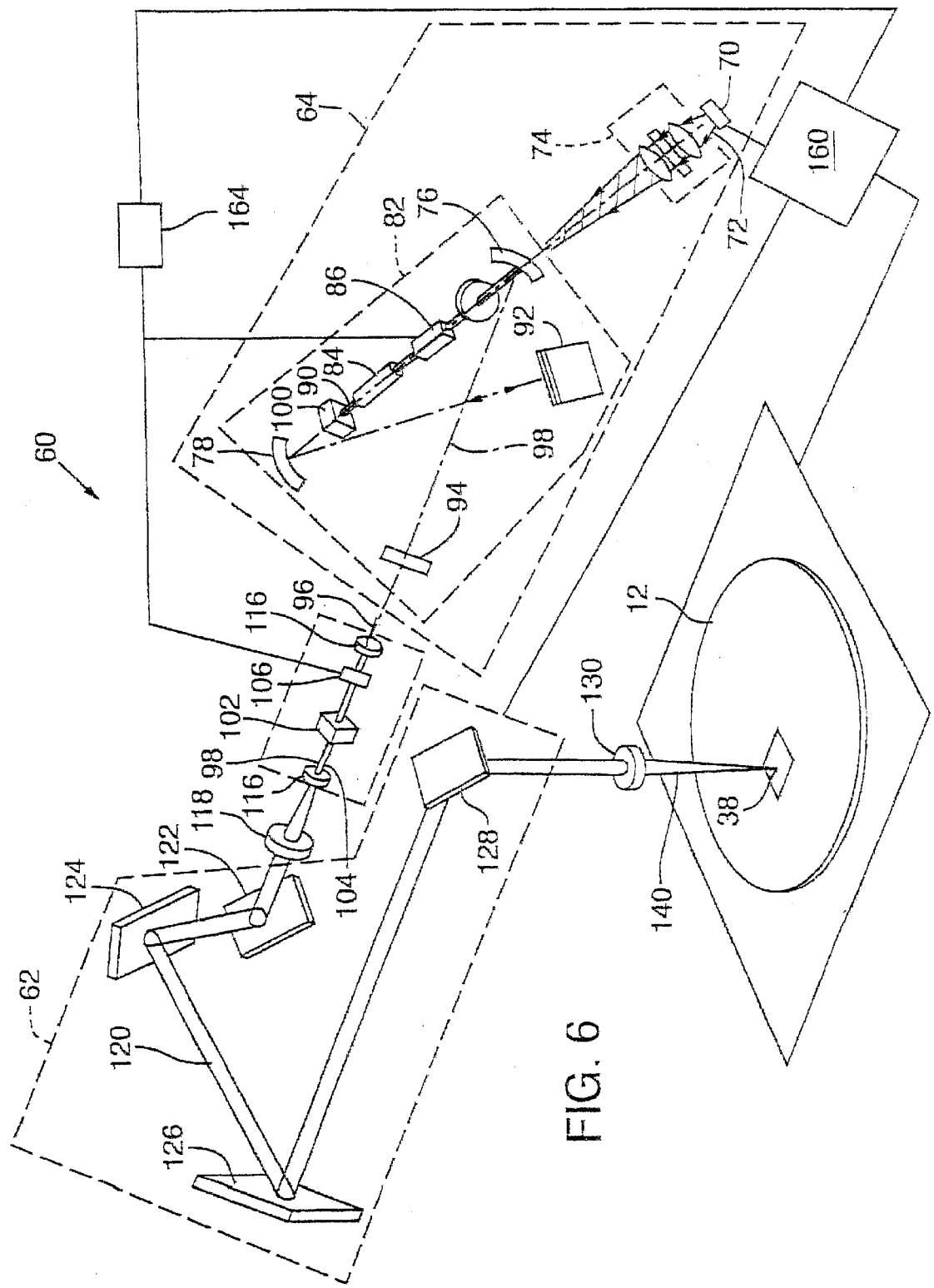
FIG. 6 is a partly schematic, simplified diagram of one embodiment of a preferred UV laser system including a workpiece positioner that cooperates with a laser processing control system for practicing the method of the present invention.

With reference to FIG. 4, the energy densities of pulses 52b can be adjusted so that bursts 50b of pulses 52b mimic the energy density profile of a conventional multiple nanosecond laser pulse. Bursts 50b can be accomplished with a simultaneously Q-switched and mode-locked laser system 60 (FIG. 6).

With reference to FIG. 5, burst 50c depicts one of a variety of different energy density profiles that can be employed advantageously to sever links 22 of link structures 36 having different types and thicknesses of link or passivation materials. Another alternative burst 50 that is not shown has initial pulses 52 with high energy density and trailing pulses 52 with decreasing energy density. Such a energy density profile for a burst 50 would be useful to clean out the bottom of the link without risk of damage to a particularly sensitive workpiece. The shape of burst 50c can be accomplished by programming the voltage to an E-O or A-O device or by employing and changing polarizer rotation.

Preferably, each burst 50 severs a single link 22. In most applications, the energy density profile of each burst 50 is identical. However, when a workpiece 12 includes different types (different materials or different dimensions) of links 22, then a variety of energy density profiles (heights and lengths and as well as the shapes) can be applied as the positioning system 62 (FIG. 6) scans the workpiece 12.

In view of the foregoing, link processing with bursts 50 of ultrashort pulses 52 offers a wider processing window and a superior quality of severed links than does conventional link processing. The versatility of pulses 52 in bursts 50 permits better tailoring to particular link characteristics. In addition to the "nonthermal" and well-controllable nature of ultrashort laser processing, the most common ultrashort laser source is at a wavelength of about 800 nm and facilitates delivery of a small-sized laser spot.

The substantially nonthermal nature of material interaction with pulses 52 permits IR laser output to be used on links 22 that are narrower without producing an irregular unacceptable explosion pattern. Laser wavelengths shorter than the IR can also be used for the process with the added advantage of smaller laser beam spot size, thus facilitating the processing of narrower and denser links. This better link removal resolution permits links 22 to be positioned closer together, increasing circuit density. Although link structures 36 can have conventional sizes, the link width 28 can, for example, be less than or equal to about 1.0 $\mu$m. Similarly, the height of the passivation layers 44 above or below the links 22 can be modified if desirable to be other than a typical 0.5 $\mu$m height since the bursts 50 of pulses 52 can be tailored. In addition, center-to-center pitch 32 between links 22 processed with bursts 50 of ultrashort pulses 52 can be substantially smaller than the pitch 32 between links 22 blown by a conventional beam-severing pulse. Link 22 can, for example, be within a distance of 2.0 $\mu$m or less from other links 22 or adjacent circuit structures 34.

FIG. 6 shows a preferred embodiment of a simplified laser system 60 including a CW mode-locked laser 64 for generating bursts of ultrashort laser pulses desirable for achieving link severing in accordance with the present invention. Preferred laser wavelengths from about 200 nm and 1320 nm include, but are not limited to, 1.3, 1.064, or 1.047, 1.03–1.05, 0.75–0.85 $\mu$m or their second, third, fourth, or fifth harmonics from Nd:YAG, Nd:YLF, Nd:YVO$_4$, Yb:YAG, or Ti:Sapphire lasers 64. Skilled persons will appreciate that lasers emitting at other suitable wavelengths are commercially available and could be employed.

Laser system 60 is modeled herein only by way of example to a second harmonic (532 nm) Nd:YAG laser 64 since the frequency doubling elements can be removed to eliminate harmonic conversion. The Nd:YAG or other solid-state laser 64 is preferably pumped by a laser diode 70 or a laser diode-pumped solid-state laser, the emission 72 of which is focused by lens components 74 into laser resonator 82. Laser resonator 82 preferably includes a lasant 84, preferably with a short absorption length, and a Q-switch 86 positioned between focusing/folding mirrors 76 and 78 along an optic axis 90. Mirror 78 reflects light to mirror 76 and to a semiconductor saturable absorber mirror device 92 for mode locking the laser 64. Mirror 76 reflects light to mirror 78 and 0p a partly reflective output coupler 94 that propagates resonator output 96 along optic axis 98. A harmonic conversion doubler 102 is preferably placed externally to resonator 82 to convert the laser beam frequency to the second harmonic laser output 104. Skilled persons will appreciate that where harmonic conversion to UV is employed, an E-O device 106 such as an optical gate or polarization state changer and a polarizer, is positioned before the harmonic conversion apparatus. Skilled person will appreciate that due to the ultrashort laser pulse width, thus a higher laser intensity, a higher laser frequency conversion efficiency can be readily achieved.

Skilled persons will appreciate that any of the second, third, or fourth harmonics of Nd:YAG (532 nm, 355 nm, 266 mn); Nd:YLF (524 nm, 349 nm, 262 nm) or the second harmonic of Ti:Sapphire (375–425 nm) can be employed to preferably process certain types of links 22 using appropriate well-known harmonic conversion techniques. Harmonic conversion processes are described in pp. 138–141, V. G. Dmitriev, et. al., "Handbook of Nonlinear Optical Crystals", Springer-Verlag, New York, 1991 ISBN 3-540-53547-0.

An exemplary ultrafast Nd:YAG or Nd:YLF laser 64 is the JAGUAR™ sold by Time-Bandwidth® of Zurich, Switzerland. The JAGUAR-QCW-1000™ provides pulses with pulse widths of up to about 8 to 10 ps at a pulse energy of greater than 1 mJ at a repetition rate of 0–100 Hz. The JAGUAR-CW-250™ provides pulses with pulse widths of up to about 25 or 30 ps at a pulse energy of greater than 250 $\mu$J at a repetition rate of 0–5 kHz.

Another exemplary laser 64 can be a mode-locked Ti-Sapphire ultrashort pulse laser with a laser wavelength in the near IR range, such as 750–850 nm. Spectra Physics makes a Ti-Sapphire ultra fast laser called the MAI TAI™ which provides ultrashort pulses 52 having a pulse width of 100 femtoseconds (fs) at 1 W of power in the 750 to 850 nm range at a repetition rate of 80 MHz. This laser 64 is pumped by a diode-pumped, frequency-doubled, solid-state green YAG laser (5 W or 10 W).

Figure 7:
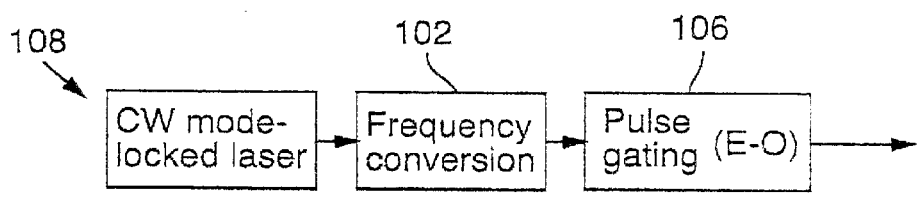
FIG. 7 is a schematic diagram of one laser configuration that can be employed in accordance with the present invention.

FIG. 7 shows a schematic diagram of a simplified alternative configuration of a laser system 108 for employing the present invention. Skilled persons will appreciate that for harmonically converted green and longer wavelength light, the E-O device 106 is preferably positioned after the harmonic conversion converter 102.

FIG. 8 shows a schematic diagram of another simplified alternative configuration of a laser system 110 for that employs a second resonator or amplifier 112.

Laser output 104 (regardless of wavelength) can be manipulated by a variety of conventional optical components 116 and 118 that are positioned along a beam path 120. Components 116 and 118 may include a beam expander or other laser optical components to collimate laser output 104 to produce a beam with useful propagation characteristics.

One or more beam reflecting mirrors 122, 124, 126 and 128 are optionally employed and are highly reflective at the laser wavelength desired, but highly transmissive at the unused wavelengths, so only the desired laser wavelength will reach link structure 36. A focusing lens 130 preferably employs an F1, F2, or F3 single component or multicomponent lens system that focuses the collimated pulsed laser system output 140 to produce a focused spot size 40 that is preferably less than 2 μm in diameter or smaller depending on the wavelength.

A preferred beam positioning system 62 is described in detail in U.S. Pat. No. 4,532,402 of Overbeck. Beam positioning system 62 preferably employs a laser controller 160 that controls at least two platforms or stages (stacked or split-axis) and coordinates with reflectors 122, 124, 126, and 128 to target and focus laser system output 140 to a desired laser link 22 on IC device or workpiece 12. Beam positioning system 62 permits quick movement between links 22 on the same or different workpieces 12 to effect unique link-severing operations based on provided test or design data.

The position data preferably direct the focused laser spot 38 over workpiece 12 to target link structure 36 with one burst 50 of ultrashort pulses 52 of laser system output 140 to remove link 22. The laser system 60 preferably severs each link 22 on-the-fly with a single burst 50 of ultrashort laser pulses 52 without stopping the beam positioning system 62 over any link 22, so high throughput is maintained. Because the bursts 50 are less than 500 ns, each burst 50 is treated like a single multiple-nanosecond pulse by positioning system 62.

Laser controller 160 is provided with instructions concerning the desired energy and pulse width of pulses 52, the number of pulses 52, and/or the shape and duration of bursts 50 according to the characteristics of link structures 36. Laser controller 160 may be influenced by timing data that synchronizes the firing of laser system 60 to the motion of the platforms such as described in U.S. Pat. No. 5,453,594 of Konecny for Radiation Beam Position and Emission Coordination System. Alternatively, skilled persons will appreciate that laser controller 160 may be used for extra-cavity modulation of laser energy via a Pockels cell or an acousto-optic device 106 and/or may optionally instruct one or more subcontrollers 164 that control Q-switch 86 or E-O device 106. Beam positioning system 62 may alternatively or additionally employ the improvements or beam positioners described in U.S. Pat. No. 5,751,585 of Cutler et al, which is assigned to the assignee of this application. Other fixed head, fast positioner head such as galvanometer, piezoelectrically, or voice coil-controlled mirrors, or linear motor driven conventional positioning systems or those employed in the 9300 or 9000 model series manufactured by Electro Scientific Industries, Inc. (ESI) of Portland, Oreg. could also be employed.

It will be obvious to those having skill in the art that many changes may be made to the details of the above-described embodiment of this invention without departing from the underlying principles thereof. The scope of the present invention should, therefore, be determined only by the following claims.

What is claimed is:

1. A method of severing electrically conductive redundant memory links positioned between respective pairs of electrically conductive contacts in a circuit fabricated on a substrate, comprising:

providing to a beam positioner beam positioning data representing one or more locations of electrically conductive redundant memory links in the circuit;

generating, from a laser, a first burst of a first set of at least two laser output pulses during a first time interval, each of the laser output pulses in the first set having a pulse width duration of shorter than 10 picoseconds and the first burst having a burst width duration of shorter than 500 nanoseconds;

directing, in response to the beam positioning data, the first burst of the first set of laser output pulses to impinge a first electrically conductive redundant memory link at a first location between first contacts, at least two of the laser output pulses from the first set removing different portions of the first conductive link and the first burst severing the first conductive link between the first contacts;

generating, from a laser, a second burst of a second set of at least two laser output pulses during a second time interval that is chronologically different from the first time interval, each laser output pulse in the second set having a pulse width duration of shorter than 10 picoseconds and the second burst having a burst width duration of shorter than 500 nanoseconds;

directing, in response to the beam positioning data, the second burst of the second set of laser output pulses to impinge a second electrically conductive redundant memory link at a second location between second contacts, the second location being distinct from the first location, at least two of the laser output pulses from the second set removing different portions of the second conductive link and the second burst severing the second conductive link between the second contacts.

2. The method of claim 1, further comprising:

generating the first and second bursts at a repetition rate of greater than one kilohertz.

3. The method of claim 1, further comprising:

generating the laser output pulses of the first and second sets at a repetition rate of greater than 10 megahertz.

4. The method of claim 1 in which the laser output pulses of the first and second sets have a pulse width duration of shorter than one picosecond.

5. The method of claim 1 in which each link forms a portion of a link structure that includes a passivation layer that overlies the link.

6. The method of claim 5 in which the passivation layers are removed by a nonthermal interaction between the laser output pulses and the passivation layers.

7. The method of claim 5 in which at least one of the laser output pulses from each set removes a 0.01–0.2 micron sublayer of the passivation layer.

8. The method of claim 7 in which at least one of the laser output pulses from each set removes a 0.01–0.03 micron sublayer of the link.

9. The method of claim 1 in which at least one of the laser output pulses from each set removes a 0.01–0.03 micron sublayer of the link.

10. The method of claim 9 in which at least one of the links comprises aluminum, chromide, copper, doped polysilicon, disilicide, gold, nickel, nickel chromide, platinum, polycide, tantalum nitride, titanium, titanium nitride, tungsten, or tungsten silicide.

11. The method of claim 1 in which the links are removed by a nonthermal interaction between the laser output pulses and the links.

12. The method of claim 1, further comprising generating the first and second sets of laser output pulses at a wavelength between about 200 nm and 1320 nm.

13. The method claim 1, further comprising generating the first and second sets of laser output pulses from a CW-pumped, mode-locked, solid-state laser.

14. The method of claim 1, further comprising severing the links without damaging the underlying substrate.

15. The method of claim 1 in which the first and second bursts have similar energy density profiles.

16. The method of claim 1 in which each of the laser output pulses in the first set has approximately the same intensity.

17. The method of claim 1 in which at least two of the laser output pulses in the first set have different intensities.

18. The method of claim 17 in which the first set of laser output pulses comprises first, second, and third chronological pulses having respective first, second, and third intensities wherein the first and third intensities are less than the second intensity.

19. The method of claim 17 in which the first set of laser output pulses comprises first, second, and third chronological pulses having respective first, second, and third intensities wherein the first intensity is greater than are the second and third intensities.

20. The method of claim 1 in which the first and second bursts are shaped to match an energy density profile of a conventional multiple-nanosecond link-processing laser pulse.

21. The method of claim 1 in which the beam positioner provides continuous relative motion between the substrate and laser spots resulting from the bursts of output pulses such that the links are processed on-the-fly.

22. The method of claim 1 in which the beam positioner comprises two stages that move the relative position between the substrate and laser spots resulting from the bursts of output pulses.

23. The method of claim 1 in which the first and second bursts each comprise at least four laser output pulses.

24. The method of claim 1 in which the links have a width that is less than one micron and the wavelength of the laser output pulses falls within the infrared region.

25. The method of claim 1 in which the first and second bursts comprise a burst width duration of shorter than 200 nanoseconds.

26. The method of claim 1 in which each link forms a portion of a link structure that includes a passivation layer that overlies the link, in which the passivation layers are removed by a substantially nonthermal interaction between the laser output pulses and the passivation layers, in which at least one of the laser output pulses from each set removes a 0.01–0.2 micron sublayer of the passivation layer, in which at least one of the laser output pulses from each set removes a 0.01–0.03 micron sublayer of the link, further comprising:
   generating the laser output pulses of the first and second sets at a repetition rate of greater than 10 MHz; and
   generating the bursts of first and second sets of laser output pulses from a CW pumped, mode-locked solid-state laser at a repetition rate of greater than 1 kHz at a wavelength between about 200 nm and 1320 nm.

27. A method of severing an electrically conductive link between a pair of electrically conductive contacts in a circuit fabricated on a substrate, comprising:
   providing to a beam positioner beam positioning data representing one or more locations of conductive links in the circuit;
   generating, from a laser, a first burst of a first set of at least two laser output pulses during a first time interval, each of the laser output pulses in the first set having a pulse width duration of shorter than 25 picoseconds and the first burst having a burst width duration of shorter than 500 nanoseconds;
   directing, in response to the beam positioning data, the first burst of the first set of laser output pulses to impinge a first conductive link at a first location between first contacts, at least two of the laser output pulses from the first set removing different portions of the first conductive link and the first burst severing the first conductive link between the first contacts;
   generating, from a laser, a second burst of a second set of at least two laser output pulses during a second time interval that is chronologically different from the first time interval, each laser output pulse in the second set having a pulse width duration of shorter than 25 picoseconds and the second burst having a burst width duration of shorter than 500 nanoseconds;
   directing, in response to the beam positioning data, the second burst of the second set of laser output pulses to impinge a second conductive link at a second location between second contacts, the second location being distinct from the first location, at least two of the laser output pulses from the second set removing different portions of the second conductive link and the second burst severing the second conductive link between the second contacts.

28. The method of claim 27 in which the links are redundant memory links, in which each link forms a portion of a link structure that includes a passivation layer that overlies the link, in which the passivation layers are removed by a substantially nonthermal interaction between the laser output pulses and the passivation layers, in which at least one of the laser output pulses from each set removes a 0.01–0.2 micron sublayer of the passivation layer, in which at least one of the laser output pulses from each set removes a 0.01–0.03 micron sublayer of the link, further comprising:
   generating the laser output pulses of the first and second sets at a repetition rate of greater than 10 MHz; and
   generating the bursts of first and second sets of laser output pulses from a pumped, mode-locked solid-state laser at a repetition rate of greater than 1 kHz at a wavelength between about 200 nm and 1320 nm.

29. The method of claim 28 in which the links form a portion of a field programmable gate array.

30. The method claim 28, further comprising generating the first and second sets of laser output pulses from a CW pumped, mode-locked solid-state laser.

31. The method of claim 28 in which the first and second bursts have similar energy density profiles.

32. The method of claim 28 in which each of the laser output pulses in the first set has approximately the same intensity.

33. The method of claim 28 in which the first set of laser output pulses comprises first, second, and third chronological pulses having respective first, second, and third intensities wherein the first and third intensities are less than the second intensity.

34. The method of claim 28 in which the first set of laser output pulses comprises first, second, and third chronological pulses having respective first, second, and third intensities wherein the first intensity is greater than are the second and third intensities.

35. The method of claim 28 in which the first and second bursts are shaped to match an energy density profile of a conventional multiple-nanosecond link-processing laser pulse.

36. The method of claim 28 in which the links are processed on-the-fly.

37. The method of claim 31 in which each of the laser output pulses in the first and second sets has approximately the same intensity.

38. The method of claim 27 in which each laser output pulse produces a laser spot on the target of less then 2 microns.

39. The method of claim 27 in which each laser output pulse produces a laser spot on the target of less then 2 microns.

40. The method of claim 39 in the laser output pulses comprise at least one of the following wavelengths: about 262, 266, 349, 375–425, 355, 524, 532, 750–850, 1030–1050, 1064, or 1032 nm.

41. The method of claim 27 in the laser output pulses comprise at least one of the following wavelengths: about 262, 266, 349, 375–425, 355, 284, 532, 750–850, 1030–1050, 1064, or 1032 nm.

42. The method of claim 28 in which each conductive link is severed by a single burst.

43. The method of claim 28 in which the passivation layer overlying the link has a thickness of about 0.2–1 microns.

44. The method of claim 41 in which the passivation layer overlying the link has a thickness of about 0.2–1 microns.

45. The method of claim 44 in which the link has a thickness of about 0.5–2 microns.

46. The method of claim 28 in which the link has a thickness of about 0.5–2 microns.

47. The method of claim 45, further comprising:

generating the first and second bursts at a repetition rate of greater than 20 kilohertz.

48. The method of claim 47 in which each burst delivers about 0.01 microjoules–10 millijoules.

49. The method of claim 28 in which each burst delivers about 0.01 microjoules–10 millijoules.

50. The method of claim 48 in which the first and second conductive links are spaced within 2 microns of each other.

51. The method of claim 26 in which at least two of the laser output pulses in each set have different intensities.

52. The method of claim 51 in which each laser output pulse produces a laser spot on the target of less them 2 microns.

53. The method of claim 52 in the laser output pulses comprise at least one of the following wavelengths: about 262, 266, 349, 375–425, 355, 524, 532, 750–850, 1030–1050, 1064, or 1032 nm.

54. The method of claim 26 in which each conductive link is severed by a single burst.

55. The method of claim 54 in which the passivation layer overlying the link has a thickness of about 0.2–1 microns.

56. The method of claim 55 in which the link has a thickness of about 0.5–2 microns.

57. The method of claim 1, further comprising:

generating the first and second bursts at a repetition rate of greater than 20 kilohertz.

58. The method of claim 56 in which each burst delivers about 0.01 microjoules–10 millijoules.

59. The method of claim 1 in which each burst delivers about 0.01 microjoules–10 millijoules.

60. The method of claim 58 in which the first and second conductive links are spaced within 2 microns of each other.

* * * * *

UNITED STATES PATENT AND TRADEMARK OFFICE
CERTIFICATE OF CORRECTION

PATENT NO. : 6,574,250 B2 Page 1 of 1
DATED : June 3, 2003
INVENTOR(S) : Yunglong Sun, Edward J. Swenson and Richard S. Harris It is certified that error appears in the above-identified patent and that said Letters Patent is hereby corrected as shown below:

Column 3,
Line 1, "burst ultrasound" should read -- burst of ultrasound --;
Line 51, "laser pulse employed" should read -- laser pulses employed --.

Column 5,
Line 50, "links 22processed" should read -- links 22 processed --.

Column 6,
Line 14, "mirror 76 and 0p" should read -- mirror 76 and to --;
Line 28, "(532 nm, 355 nm, 266 mn)" should read -- (532 nm, 355 nm, 266 nm) --.

Column 11,
Lines 5 and 8, "less then 2" should read -- less than 2 --.
Line 16, "284" should read -- 524 --.

Column 12,
Line 8, "less then 2" should read -- less than 2 --.

Signed and Sealed this

Second Day of December, 2003

JAMES E. ROGAN
*Director of the United States Patent and Trademark Office*